(12) United States Patent
Matsuda (10) Patent No.: US 8,134,160 B2
(45) Date of Patent: Mar. 13, 2012

(54) CHIP-TYPE LED HAVING AN INSULATING SUBSTRATE IN WHICH A FIRST CONCAVE HOLE AND A SECOND CONCAVE HOLE ARE FORMED

(75) Inventor: Makoto Matsuda, Mihara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 290 days.

(21) Appl. No.: 12/171,914

(22) Filed: Jul. 11, 2008

(65) Prior Publication Data
US 2009/0014749 A1    Jan. 15, 2009

(30) Foreign Application Priority Data
Jul. 12, 2007    (JP) ................................ 2007-183342

(51) Int. Cl.
*H01L 27/15* (2006.01)
(52) U.S. Cl. .................... 257/79; 257/81; 257/E33.001; 438/25; 438/26
(58) Field of Classification Search .............. 438/22–26; 257/79–103, E33.001, E33.061
See application file for complete search history.

(56) References Cited

U.S. PATENT DOCUMENTS

| | | | |
|---|---|---|---|
| 6,583,447 B2* | 6/2003 | Wang et al. ...................... | 257/99 |
| 6,835,960 B2* | 12/2004 | Lin et al. .......................... | 257/81 |
| 6,861,675 B2* | 3/2005 | Tomioka et al. ................. | 257/82 |
| 7,078,253 B2* | 7/2006 | Brunner et al. ................. | 438/25 |
| 7,105,862 B2* | 9/2006 | Waitl et al. ...................... | 257/99 |
| 7,491,000 B2* | 2/2009 | Takehashi et al. .............. | 385/92 |
| 2001/0052600 A1* | 12/2001 | Sakamoto et al. .............. | 257/79 |
| 2004/0173808 A1* | 9/2004 | Wu .................................... | 257/99 |
| 2004/0208210 A1* | 10/2004 | Inoguchi .......................... | 372/36 |
| 2006/0018120 A1* | 1/2006 | Linehan et al. ................. | 362/247 |

FOREIGN PATENT DOCUMENTS

| | | |
|---|---|---|
| JP | 07-235696 | 9/1995 |
| JP | 2002-252372 | 9/2002 |
| JP | 2007-165502 | 6/2007 |

\* cited by examiner

*Primary Examiner* — Khiem D Nguyen
(74) *Attorney, Agent, or Firm* — Morrison & Foerster LLP (57) ABSTRACT

An embodiment of the present invention has an insulating substrate in which a first concave hole for mounting an LED chip and a second concave hole for connecting a metallic small-gauge wire are formed, where a metallic sheet that serves as a first wiring pattern is formed at a portion that includes the first concave hole, a metallic sheet that serves as a second wiring pattern is formed at a portion that includes the second concave hole, an LED chip is mounted upon the metallic sheet inside the first concave hole, the LED chip is electrically connected to the metallic sheet inside the second concave hole via a metallic small-gauge wire, and the chip-type LED is sealed with a clear resin.

7 Claims, 7 Drawing Sheets

CHIP-TYPE LED HAVING AN INSULATING SUBSTRATE IN WHICH A FIRST CONCAVE HOLE AND A SECOND CONCAVE HOLE ARE FORMED

BACKGROUND OF THE INVENTION

This application claims priority under 35 U.S.C. §119(a) on Patent Application No. 2007-183342 filed in Japan on Jul. 12, 2007, the entire contents of which are herein incorporated by reference.

The present invention relates to a surface-mounted chip-type LED and a method of manufacture thereof, used as a light source in various types of display panels, backlighting for liquid-crystal display devices, and in lighted switches and the like.

Chip-type LEDs have conventionally been used as light sources in various types of display panels, backlighting for liquid-crystal display devices, and in lighted switches and the like.

Figure 8:
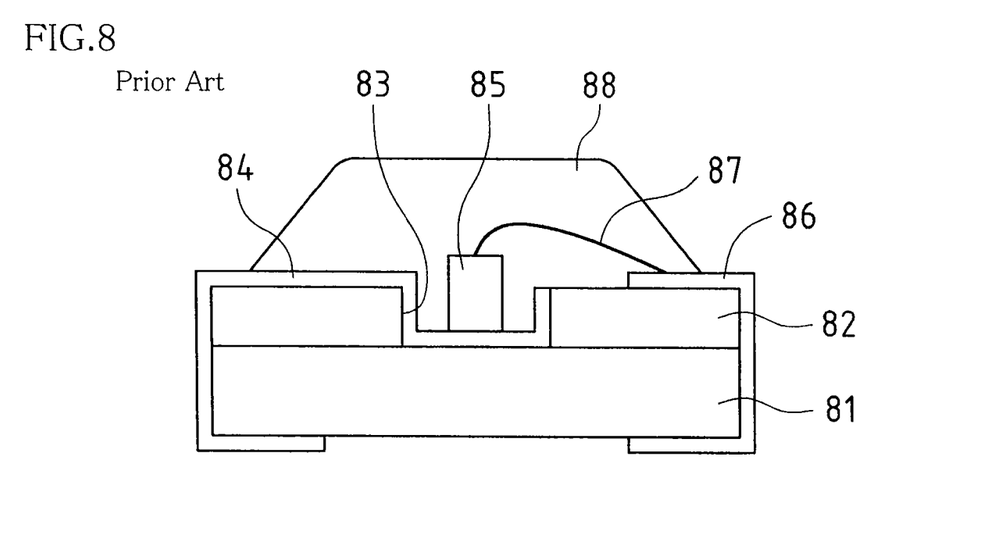
FIG. 8 is a cross-sectional view illustrating an example of the structure of a conventional chip-type LED.

FIG. 8 illustrates an example of the structure of such a conventional chip-type LED.

This conventional chip-type LED has a dual-layer structure using insulating substrates 81 and 82; a through-hole 83 is formed in the upper insulating substrate 82, and one wiring pattern 84 is formed so as to extend to the inside bottom of the through-hole 83 (in other words, to the upper surface of the lower insulating substrate 81). An LED chip 85 is mounted upon the wiring pattern 84 within the through-hole 83 and is connected to another wiring pattern 86 with a metallic small-gauge wire (e.g. an Au wire or the like) 87. Finally, the surface of the insulating substrate 82 is sealed with a clear resin 88 so that the LED chip 85 and the metallic small-gauge wire 87 are also contained within the clear resin 88.

Because the LED chip 85 is mounted within the through-hole 83, a chip-type LED constructed in such a manner achieves a slim size. However, such a chip-type LED is problematic in that the inner circumferential surface of the through-hole 83 is formed perpendicular to the bottom surface of that through-hole 83, causing low upward reflective efficiency when the LED chip 85 is lit. Furthermore, two insulating substrates, or the substrates 81 and 82, are required, and moreover, because the LED chip 85 is mounted upon the lower insulating substrate 82, the insulating substrate 82 is required to have a certain minimum thickness of an amount that allows the LED chip 85 to be mounted thereupon. This results in problems that it is difficult to achieve a slim size, and the cost of the chip-type LED increases as well.

Chip-type LEDs that attempt to solve these problems have accordingly been provided (for example, see JP H7-235696A).

Figure 9:
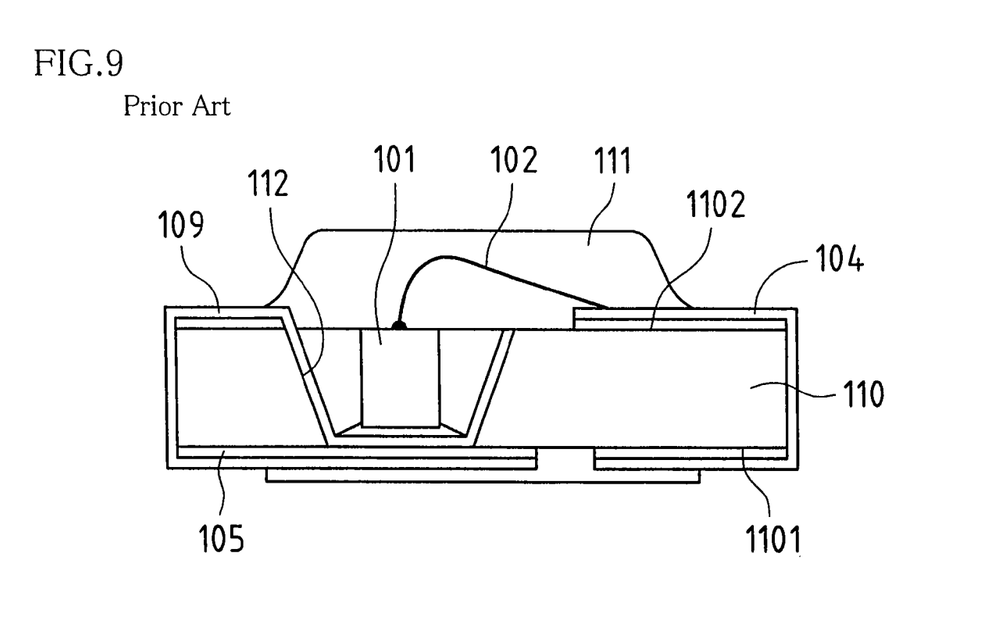
FIG. 9 is a cross-sectional view illustrating an example of the structure of another conventional chip-type LED.

As shown in FIG. 9, this chip-type LED is structured as follows. A metal sheet 105, which forms one wiring pattern 109, is attached to the back side 1101 of an insulating substrate 110, in which a through-hole 112 is formed, and an LED chip 101 is mounted upon the metal sheet 105 within the through-hole 112 (in other words, upon the wiring pattern 109). The LED chip 101 is connected, using a metallic small-gauge wire 102, to another wiring pattern 104 that is formed on the front surface 1102 of the insulating substrate 110, which is then sealed with a clear resin 111.

With such a structure, the LED chip 101 is mounted directly onto the metal sheet 105, eliminating the need for the second substrate used in the conventional chip-type LED, and the thickness of the chip-type LED can be reduced by that amount as a result.

However, the chip-type LED of the abovementioned JP H7-235696A, connects the LED chip 101 to the other wiring pattern 104 that is formed on the front surface 1102 of the insulating substrate 110 using the metallic small-gauge wire 102. In other words, the position at which the metallic small-gauge wire 102 is connected to the other wiring pattern 104 is high, meaning that the height at which the metallic small-gauge wire 102 is disposed cannot be lowered significantly. This leads to a problem in that the degree to which the thickness of the chip-type LED can be reduced is limited to that height. There is a further problem in that it is necessary to form the other wiring pattern 104 across the external surface of the insulating substrate 110 and to the bottom surface of the substrate, which complicates the manufacturing process.

SUMMARY OF THE INVENTION

Having been conceived to solve such problems, it is an object of the present invention to provide a chip-type LED that eliminates a substrate thickness for mounting an LED chip, thereby achieving a higher level of thinness, improves the reflective efficiency when the LED chip is lit, and simplifies the manufacturing process, as well as to provide a method of manufacture of such a chip-type LED.

To solve the abovementioned problems, the chip-type LED of the present invention has an insulating substrate in which a first concave hole for mounting an LED chip and a second concave hole for connecting a metallic small-gauge wire are formed, where a metallic sheet that serves as a first wiring pattern is formed at a portion that includes the first concave hole, a metallic sheet that serves as a second wiring pattern is formed at a portion that includes the second concave hole, an LED chip is mounted upon the metallic sheet inside the first concave hole, the LED chip is electrically connected to the metallic sheet inside the second concave hole via a metallic small-gauge wire, and the chip-type LED is sealed with a clear resin.

With such a configuration, the surface on which the LED chip is mounted and the surface to which the end of the metallic small-gauge wire, the other end of which is connected to the LED chip, is connected are formed upon the metallic sheets, which makes it possible to lower the height of the metallic small-gauge wire. Furthermore, because the LED chip is mounted directly onto the metallic sheet (the first wiring pattern), the need for the conventional second substrate is eliminated, which makes it possible to reduce the thickness of the chip-type LED by that amount; the height of the metallic small-gauge wire can also be lowered more than is conventionally possible, enabling an even higher level of thinness.

Furthermore, by removing the metal sheets, the first wiring pattern on which the LED ship is mounted and the second wiring pattern to which the other end of the metallic small-gauge wire is connected can easily be electrically separated from one another. Further still, because the wiring patterns formed within the respective concave holes are directly connected to the bottom surfaces of the metallic sheets, forming a wiring pattern or the like around the outside of the insulating substrate is not necessary, making the method of manufacture easier than the method of manufacturing the conventional chip-type LED. The manufacturing cost can also therefore be reduced.

In this case, the bottom surface of the first concave hole on which the LED chip is mounted and the bottom surface of the second concave hole to which the metallic small-gauge wire is connected to from the LED chip are formed at approximately the same height. Through this, the adjustment of the laser output and so on is not necessary during processing, making the process for creating the concave holes easy.

Furthermore, the second concave hole to which the metallic small-gauge wire is connected to from the LED chip may be formed in no less than two places. By forming the concave holes in no less than two places, a thin design can be achieved even with a complex wiring structure, such as when using a metallic small-gauge wire without using the surface on which the LED chip is mounted as the lead for the electrodes of the LED chip, when, for example, the electrode structure of the LED chip has anode and cathode electrodes formed on the front surface side.

Moreover, the chip-type LED of the present invention may be configured so that a groove portion for disposing the metallic small-gauge wire is formed in the surface of a wall between the first concave hole and the second concave hole. By forming a groove portion and passing the metallic small-gauge wire therethrough, the height at which the metallic small-gauge wire is disposed can be lowered even further, making it possible to realize an even thinner design, by that amount, for the chip-type LED.

In this case, the clear resin may include a fluorescent material. Furthermore, it is preferable for the inner circumferential surfaces of the concave holes to be formed at slopes so that the concave holes flare outwards in the direction from the rear surface of the insulating substrate to the front surface of the insulating substrate. Through this, when the present chip-type LED is used as a light source in various types of display panels, backlighting for liquid-crystal display devices, and in lighted switches and the like, and is lit, the light directed toward the side surfaces is reflected upward by those sloped surfaces, which makes it possible to improve the upward reflective efficiency of the chip-type LED.

Furthermore, a method of manufacturing a chip-type LED of the present invention comprises the steps of: forming metallic sheets on the front surface and rear surface of an insulating substrate; removing the metallic sheet at an LED chip mounting position and a metallic small-gauge wire connecting position on the front surface side of the insulating substrate; forming concave holes having sloped surfaces through a laser process in the regions from which the metallic sheet has been removed, at depths so that they extend to the metallic sheet on the rear surface of the insulating substrate; forming a plate layer so as to extend across the side surfaces of the concave holes and the bottom surface of the metallic sheet; forming a layer including Au on the front surface of the plate layer through vapor deposition; forming an insulating region; mounting an LED chip to the bottom surface of one of the concave holes; electrically connecting the LED chip to the bottom surface of the other concave hole using a metallic small-gauge wire; and sealing the LED chip and the metallic small-gauge wire in a resin mold.

According to the manufacturing method of the present invention, forming a wiring pattern or the like around the outside of the insulating substrate is not necessary, which makes the manufacturing method that much easier, and can also reduce the manufacturing cost. In addition, when laser light is irradiated onto the portion of the insulating substrate at which the LED chip is to be mounted, and a through-hole is formed so as to reach the metallic sheet on the rear surface of the insulating substrate, the laser light removes the insulating portion from the center and moving outward when removing the target area on the insulating substrate, making it possible to simultaneously form the inner circumferential surface of the formed through-hole so that it has sloped surfaces (bowed surfaces). To put it differently, it is possible to form the through holes and the sloped surfaces on the inners walls thereof at the same time simply by irradiating laser light.

According to the present invention, the surface on which the LED chip is mounted and the surface to which the end of the metallic small-gauge wire, the other end of which is connected to the LED chip, is connected are formed upon metallic sheets, which makes it possible to lower the height of the metallic small-gauge wire. Furthermore, because the LED chip is mounted directly onto the metallic sheet (the first wiring pattern), the need for the conventional second substrate is eliminated, which makes it possible to reduce the thickness of the chip-type LED by that amount; the height of the metallic small-gauge wire can also be lowered more than is conventionally possible, enabling an even higher level of thinness.

BEST MODE FOR CARRYING OUT THE INVENTION

Hereinafter, embodiments of the present invention shall be described with reference to the drawings.

First Embodiment

Figure 1:
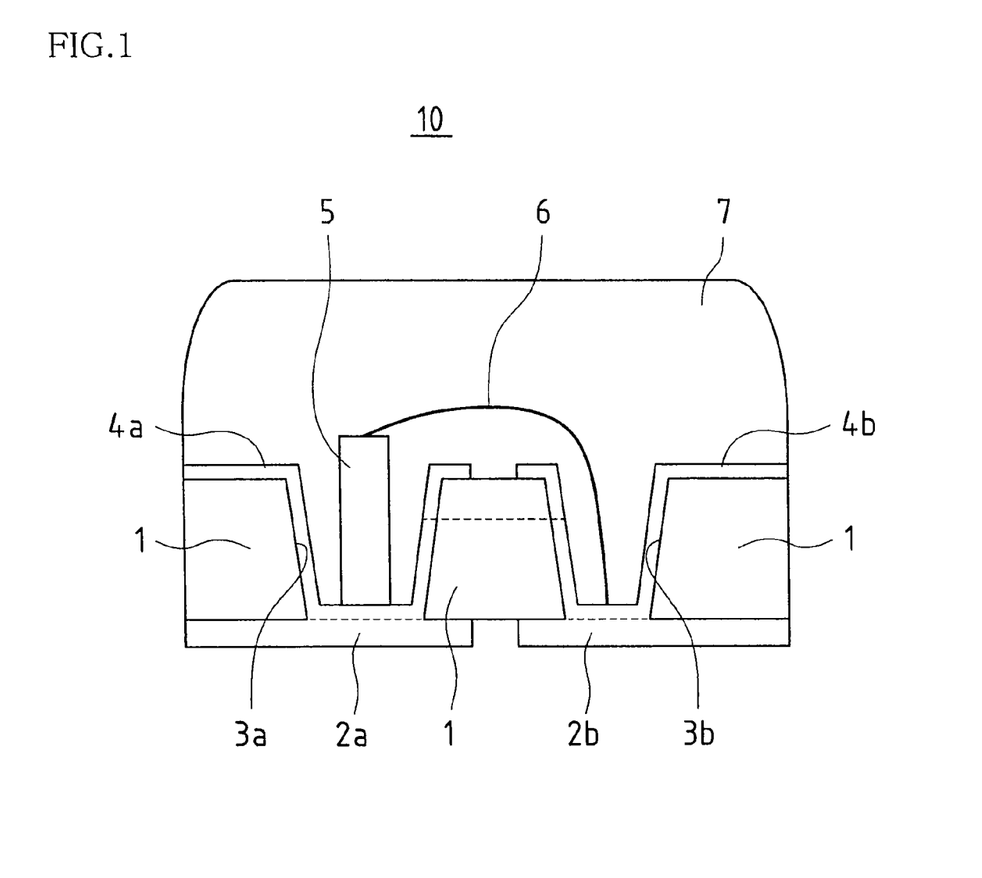
FIG. 1 is a cross-sectional view of a chip-type LED according to a first embodiment.

FIG. 1 is a cross-sectional view of a chip-type LED 10 according to the present first embodiment.

With the chip-type LED 10, a first concave hole (through-hole) 3a used for mounting an LED chip and a second concave hole (through-hole) 3b for connecting a metallic small-gauge wire are formed in an insulating substrate 1, and metallic (Cu) sheets 2a and 2b, which serve as the wiring patterns for the respective concave holes, are formed on the rear side of the insulating substrate 1 so as to be electrically separated from one another. A metallic sheet 4a, serving as a first wiring pattern at a portion that includes the first concave hole 3a, and a metallic sheet 4b, serving as a second wiring pattern at a portion that includes the second concave hole 3b, are formed on the front surface of the insulating substrate 1. Using this wiring structure, an LED chip 5 is mounted upon the metallic sheet 4a on the bottom surface portion of the first concave hole 3a, and the LED chip 5 is electrically connected to the metallic sheet 4b on the bottom surface portion of the second concave hole 3b via a metallic small-gauge wire 6. In this state, the entire front surface of the insulating substrate 1 is sealed with a clear resin 7 so that the LED chip 5 and the metallic small-gauge wire 6 are also contained within the clear resin 7.

In the present first embodiment, the insulating substrate 1 is formed from a glass epoxy resin with a thickness of approximately 50 μm. Furthermore, the metallic (Cu) sheets 2a and 2b formed on the rear side of the insulating substrate 1 are formed at thicknesses of approximately 20 μm. Finally, in the present embodiment, the internal diameter of the first concave hole 3a used for mounting the LED chip is φ470 μm, whereas the internal diameter of the second concave hole 3b for connecting the metallic small-gauge wire is φ180 μm.

As described here, in the present first embodiment, the surface on which the LED chip 5 is mounted and the surface to which the end of the metallic small-gauge wire 6, the other end of which is connected to the LED chip 5, is connected are formed upon the metallic sheets 2a and 2b respectively, which makes it possible to lower the height at which the metallic small-gauge wire 6 is disposed. Furthermore, because the LED chip 5 is mounted directly onto the metallic sheets 4a and 2a, the need for the conventional second substrate is eliminated, which makes it possible to reduce the thickness of the chip-type LED by that amount; the height of the metallic small-gauge wire 6 can also be lowered more than is conventionally possible, enabling an even higher level of thinness.

Next, a method for manufacturing the chip-type LED 10 configured as described above shall be described with reference to FIGS. 2A through 2H.

Figure 2A:
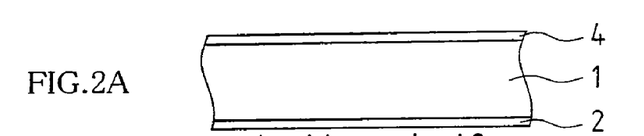
FIGS. 2A through 2H are descriptive diagrams illustrating a method of manufacture for the chip-type LED according to the first embodiment.

In the first step, metallic sheets 2 and 4 are formed on the front surface and rear surface of the insulating substrate 1, respectively (FIG. 2A).

Figure 2B:
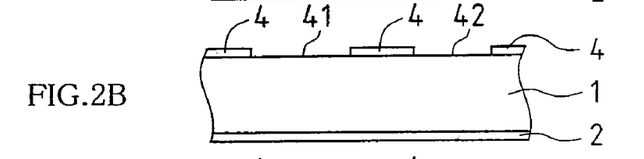

In the next step, the metallic sheet 4 is removed at an LED chip mounting position 41 and a metallic small-gauge wire connecting position 42 on the front surface side of the insulating substrate 1 (FIG. 2B).

Figure 2C:
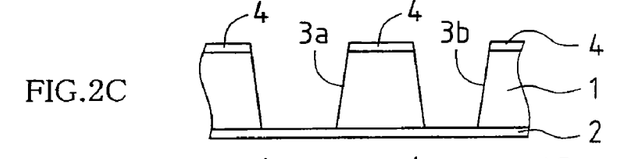

In the next step, the concave holes 3a and 3b having sloped surfaces are formed through a laser process in the regions 41 and 42, from which the metallic sheet 4 has been removed; the concave holes 3a and 3b are formed at depths so that they extend to the metallic sheet 2 on the rear surface of the insulating substrate 1 (FIG. 2C). In the present first embodiment, the internal diameter of the first concave hole 3a used for mounting the LED chip is φ470 μm, whereas the internal diameter of the second concave hole 3b for connecting the metallic small-gauge wire is φ180 μm.

Figure 2D:
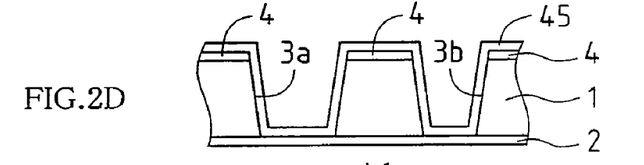

In the next step, a 20 μm-thick Cu plate layer 45 is formed, through plating, from the front surface side of the insulating substrate 1, so as to extend across the side surfaces of the concave holes 3a and 3b and the bottom surface of the metallic sheet 2 (FIG. 2D). Areas where the Cu plating is unnecessary are protected using a resist.

In the next step, a 10 μm-thick Ni/Au layer is formed of the surface of the plate layer 45 through vapor deposition.

Figure 2E:
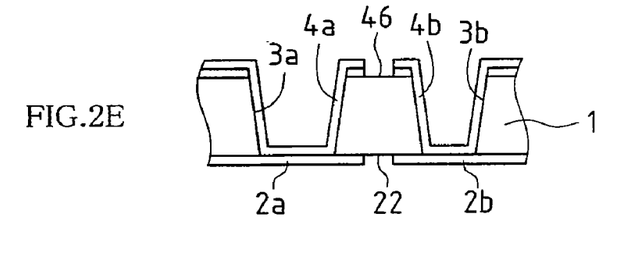

In the next step, the unnecessary portion of the Ni/Au layer, Cu plate layer 45, and metallic sheet 4 on the front surface of the insulating substrate 1 are removed (indicated by reference numeral 46), and the unnecessary portion of the metallic sheet 2 on the rear surface of the insulating substrate 1 is also removed (indicated by reference numeral 22), in order to form insulating regions (FIG. 2E). Through this, the metallic sheet 4a, which serves as the first wiring pattern, and the metallic sheet 4b, which serves as the second wiring pattern, are formed on the front surface of the insulating substrate 1 in an insulated state. Meanwhile, a metallic sheet 2a opposite the metallic sheet 4a serving as the first wiring pattern, and a metallic sheet 2b opposite the metallic sheet 4b serving as the second wiring pattern, are formed on the rear surface of the insulating substrate 1 in an insulated state.

Figure 2F:
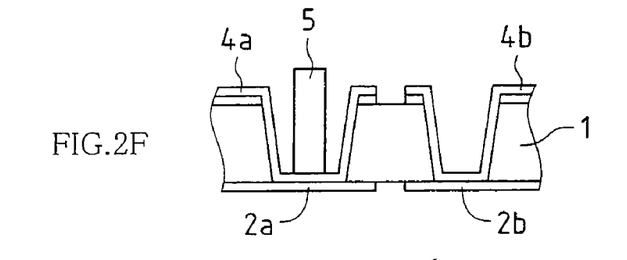

In the next step, the LED chip 5 is mounted onto the metallic sheet 4a on the bottom surface of the concave hole 3a, which is for mounting the LED chip, using a silver paste (FIG. 2F).

Figure 2G:
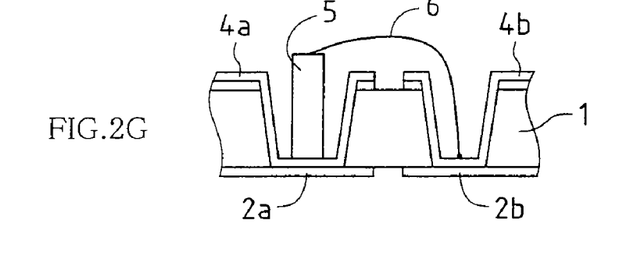

In the next step, the mounted LED chip 5 is electrically connected to the metallic sheet 4b on the bottom surface of the concave hole 3b, which is for connecting a metallic small-gauge wire, using the metallic small-gauge wire 6, by bonding the metallic small-gauge wire 6 thereto (FIG. 2G).

Figure 2H:
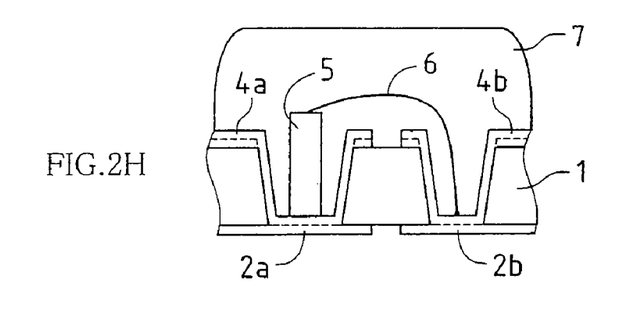

In the next step, the entire front surface of the insulating substrate 1 is sealed with, for example, silicon resin, which is a clear resin, so that the LED chip 5 and the metallic small-gauge wire 6 are also contained within the clear resin (FIG. 2H).

Finally, through dice cutting, the chip-type LED 10 is manufactured at dimensions of 1.6 mm in width, 0.8 mm in thickness, and 0.2 mm in height (see FIG. 1).

Second Embodiment

Figure 3:
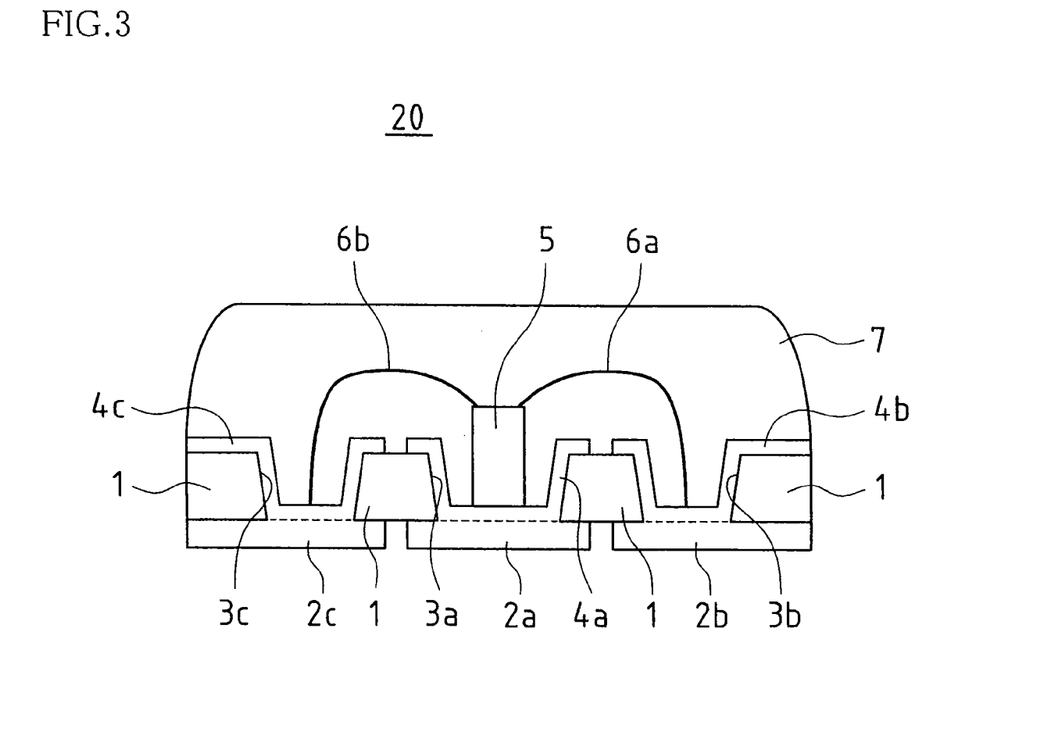
FIG. 3 is a cross-sectional view of a chip-type LED according to a second embodiment.

FIG. 3 is a cross-sectional view of a chip-type LED 20 according to the present second embodiment. In the following descriptions, members that are the same (or that have the same functionality) as those in the abovementioned first embodiment are given the same reference numerals.

With the chip-type LED 20, a first concave hole (through-hole) 3a used for mounting an LED chip is formed in an insulating substrate 1, and second and third concave holes (through-holes) 3b and 3c for connecting a metallic small-gauge wire are formed in the insulating substrate 1 on both sides of the first concave hole 3a. Metallic (Cu) sheets 2a, 2b, and 2c, which serve as the wiring patterns for the respective concave holes, are formed on the rear side of the insulating substrate 1 so as to be electrically separated from one another. A metallic sheet 4a, serving as a first wiring pattern at a portion that includes the first concave hole 3a, a metallic sheet 4b, serving as a second wiring pattern at a portion that includes the second concave hole 3b, and a metallic sheet 4c, serving as a third wiring pattern at a portion that includes the third concave hole 3c, are formed on the front surface of the insulating substrate 1. Using this wiring structure, an LED chip 5 is mounted upon the metallic sheet 4a on the bottom surface portion of the first concave hole 3a, and the LED chip 5 is electrically connected to the metallic sheet 4b on the bottom surface portion of the second concave hole 3b via a metallic small-gauge wire 6a and to the metallic sheet 4c on the bottom surface portion of the second concave hole 3c via a metallic small-gauge wire 6b. In this state, the entire front surface of the insulating substrate 1 is sealed with a clear resin 7 that includes a fluorescent material, so that the LED chip 5 and the metallic small-gauge wires 6a and 6b are also contained within the clear resin 7.

In the present second embodiment, the insulating substrate 1 is formed from a glass epoxy resin with a thickness of approximately 60 μm. Furthermore, the metallic (Cu) sheets 2a, 2b, and 2c formed on the rear side of the insulating substrate 1 are formed at thicknesses of approximately 25 μm. Finally, in the present embodiment, the internal diameter of the first concave hole 3a used for mounting the LED chip is φ500 μm, whereas the internal diameter of the second and third concave holes 3b and 3c for connecting the metallic small-gauge wires are each φ200 μm.

As described here, in the present second embodiment, the surface on which the LED chip 5 is mounted and the surfaces to which the ends of the metallic small-gauge wires 6a and 6b, the other ends of which are connected to the LED chip 5, are connected are formed upon the metallic sheets 2a, 2b, and 2c respectively, which makes it possible to lower the height at which the metallic small-gauge wires 6a and 6b are disposed. Furthermore, because the LED chip 5 is mounted directly onto the metallic sheets 4a and 2a, the need for the conventional second substrate is eliminated, which makes it possible to reduce the thickness of the chip-type LED by that amount; the height of the metallic small-gauge wires 6a and 6b can also be lowered more than is conventionally possible, enabling an even higher level of thinness.

Next, a method for manufacturing the chip-type LED 20 configured as described above shall be described with reference to FIGS. 4A through 4H.

Figure 4A:
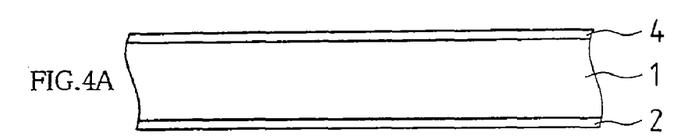
FIGS. 4A through 4H are descriptive diagrams illustrating a method of manufacture for the chip-type LED according to the second embodiment.

In the first step, metallic sheets 2 and 4 are formed on the front surface and rear surface of the insulating substrate 1, respectively (FIG. 4A).

Figure 4B:
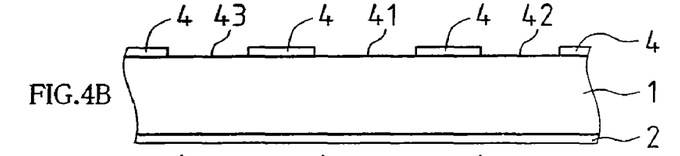

In the next step, the metallic sheet 4 is removed at an LED chip mounting position 41 and metallic small-gauge wire connecting positions 42 and 43 on the front surface side of the insulating substrate 1 (FIG. 4B).

Figure 4C:
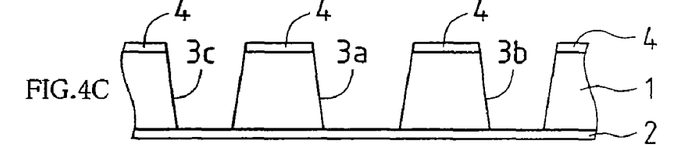

In the next step, the concave holes 3a, 3b, and 3c having sloped surfaces are formed through a laser process in the regions 41, 42, and 43, from which the metallic sheet 4 has been removed; the concave holes 3a, 3b, and 3c are formed at depths so that they extend to the metallic sheet 2 on the rear surface of the insulating substrate 1 (FIG. 4C). In the present second embodiment, the internal diameter of the first concave hole 3a used for mounting the LED chip is ϕ500 μm, whereas the internal diameter of the second and third concave holes 3b and 3c for connecting the metallic small-gauge wires are each ϕ200 μm.

Figure 4D:
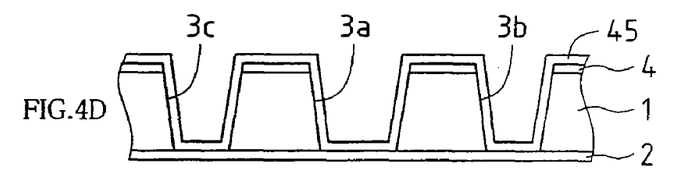

In the next step, a 15 μm-thick Cu plate layer 45 is formed, through plating, from the front surface side of the insulating substrate 1, so as to extend across the side surfaces of the concave holes 3a, 3b, and 3c and the bottom surface of the metallic sheet 2 (FIG. 4D). Areas where the Cu plating is unnecessary are protected using a resist.

In the next step, a 15 μm-thick Ni/Au layer is formed of the surface of the plate layer 45 through vapor deposition.

Figure 4E:
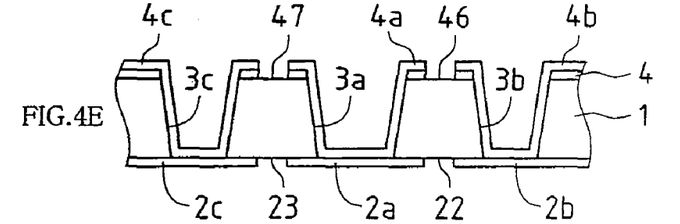

In the next step, the unnecessary portions of the Ni/Au layer, Cu plate layer 45, and metallic sheet 4 on the front surface of the insulating substrate 1 are removed (indicated by reference numerals 46 and 47), and the unnecessary portions of the metallic sheet 2 on the rear surface of the insulating substrate 1 are also removed (indicated by reference numerals 22 and 23), in order to form insulating regions (FIG. 4E). Through this, the metallic sheet 4a, which serves as the first wiring pattern, the metallic sheet 4b, which serves as the second wiring pattern, and the metallic sheet 4c, which serves as the third wiring pattern, are formed on the front surface of the insulating substrate 1 in an insulated state. Meanwhile, a metallic sheet 2a opposite the metallic sheet 4a serving as the first wiring pattern, a metallic sheet 2b opposite the metallic sheet 4b serving as the second wiring pattern, and a metallic sheet 2c opposite the metallic sheet 4c serving as the third wiring pattern are formed on the rear surface of the insulating substrate 1 in an insulated state.

Figure 4F:
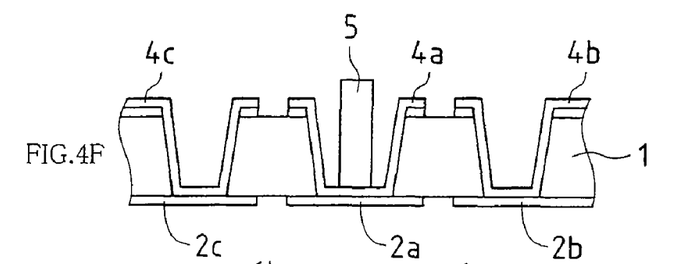

In the next step, the LED chip 5 is mounted onto the metallic sheet 4a on the bottom surface of the concave hole 3a, which is for mounting the LED chip, using a silver paste (FIG. 4F).

Figure 4G:
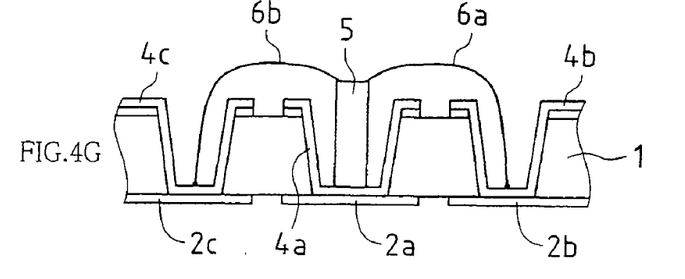

In the next step, the mounted LED chip 5 is electrically connected to the metallic sheet 4b on the bottom surface of the concave hole 3b, which is for connecting a metallic small-gauge wire, using the metallic small-gauge wire 6a, by bonding the metallic small-gauge wire 6a thereto, and the mounted LED chip 5 is then electrically connected to the metallic sheet 4c on the bottom surface of the concave hole 3c, which is for connecting a metallic small-gauge wire, using the metallic small-gauge wire 6b, by bonding the metallic small-gauge wire 6b thereto (FIG. 4G).

Figure 4H:
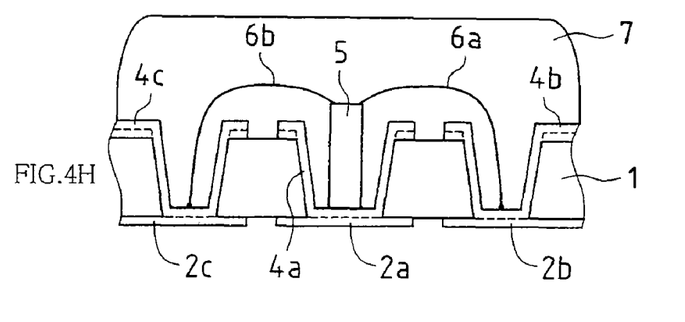

In the next step, the entire front surface of the insulating substrate 1 is sealed with, for example, silicon resin, which is a clear resin, that has had a fluorescent material added thereto, so that the LED chip 5 and the metallic small-gauge wires 6a and 6b are also contained within the clear resin (FIG. 4H). $(Ba,Sr)_2SiO_4:Eu$, $CaAlSiN_3:Eu$, or the like may be used as the fluorescent material.

Finally, through dice cutting, the chip-type LED 20 is manufactured at dimensions of 1.5 mm in width, 0.8 mm in thickness, and 0.18 mm in height (see FIG. 3).

Third Embodiment

Figure 5:
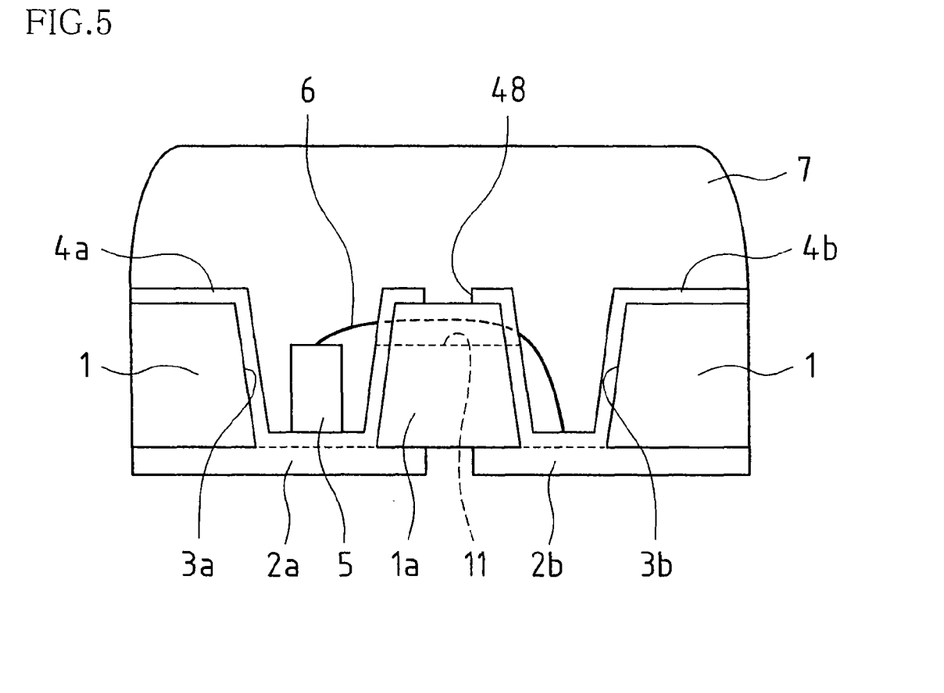
FIG. 5 is a cross-sectional view of a chip-type LED according to a third embodiment.
Figure 6:
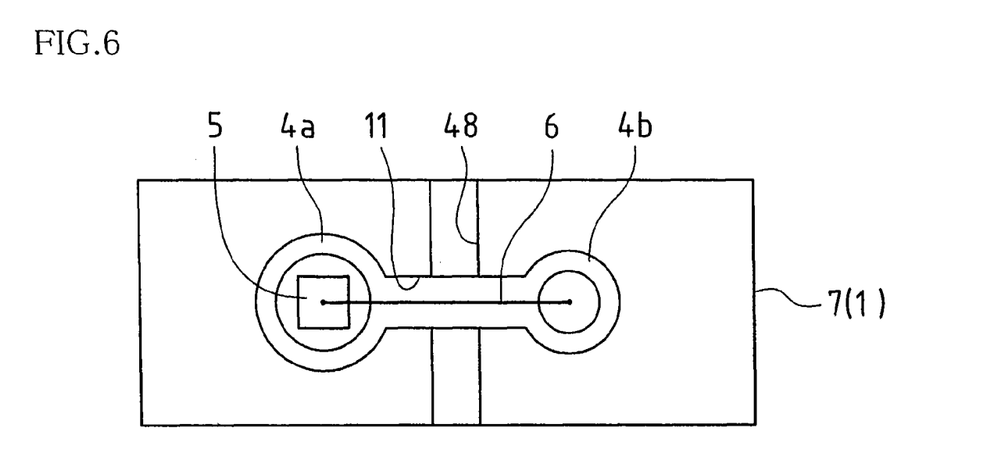
FIG. 6 is a plan view of the chip-type LED according to the third embodiment.

FIGS. 5 and 6 are cross-section and plan views, respectively, of a chip-type LED 30 according to the third embodiment. In the following descriptions, members that are the same (or that have the same functionality) as those in the abovementioned first embodiment are given the same reference numerals.

With the chip-type LED 30, a first concave hole (through-hole) 3a used for mounting an LED chip and a second concave hole (through-hole) 3b for connecting a metallic small-gauge wire are formed in an insulating substrate 1, and metallic (Cu) sheets 2a and 2b, which serve as the wiring patterns for the respective concave holes, are formed on the rear side of the insulating substrate 1 so as to be electrically separated from one another. A metallic sheet 4a, serving as a first wiring pattern at a portion that includes the first concave hole 3a, and a metallic sheet 4b, serving as a second wiring pattern at a portion that includes the second concave hole 3b, are formed on the front surface of the insulating substrate 1. The metallic sheets 4a and 4b are insulated from one another by forming a cut-out portion 48, which removes part of the metallic sheet 4, in the central part of the front surface of a partition wall 1a, the cut-out portion 48 having a constant width, and the partition wall 1a serving as a partition between the first concave hole 3a and the second concave hole 3b. Furthermore, a concave groove 11, of a predetermined depth, is formed in the front surface of the partition wall 1a, in the direction orthogonal to the cut-out portion 48. In other words, the concave groove 11 spans across the first concave hole 3a and the second concave hole 3b.

Using this wiring structure, an LED chip 5 is mounted upon the metallic sheet 4a on the bottom surface portion of the first concave hole 3a, and the LED chip 5 is electrically connected to the metallic sheet 4b on the bottom surface portion of the second concave hole 3b via a metallic small-gauge wire 6. At this time, the metallic small-gauge wire 6 is passed through the concave groove 11 within the partition wall 1a. In other words, the metallic small-gauge wire 6 is arranged so that is does not protrude upward from the surface of the insulating substrate 1. In this state, the entire front surface of the insulating substrate 1 is sealed with a clear resin 7 that includes a fluorescent material, so that the LED chip 5 and the metallic small-gauge wire 6 are also contained within the clear resin.

In the present third embodiment, the insulating substrate 1 is formed from a glass epoxy resin with a thickness of approximately 55 μm. Furthermore, the metallic (Cu) sheets 2a and 2b formed on the rear side of the insulating substrate 1 are formed at thicknesses of approximately 18 μm. Finally, in the present embodiment, the internal diameter of the first concave hole 3a used for mounting the LED chip is ϕ400 μm, whereas the internal diameter of the second concave hole 3*b* for connecting the metallic small-gauge wire is φ150 µm. The depth of the concave groove 11 is 25 µm.

As described here, in the present third embodiment, the surface on which the LED chip 5 is mounted and the surface to which the end of the metallic small-gauge wire 6, the other end of which is connected to the LED chip 5, is connected are formed upon the metallic sheets 2*a* and 2*b* respectively, and the metallic small-gauge wire 6 is passed through the concave groove 11, which makes it possible to lower the height at which the metallic small-gauge wire 6 is disposed even more than in the first and second embodiments. Furthermore, because the LED chip 5 is mounted directly onto the metallic sheets 4*a* and 2*a*, the need for the conventional second substrate is eliminated, which makes it possible to reduce the thickness of the chip-type LED by that amount.

Next, a method for manufacturing the chip-type LED 30 configured as described above shall be described with reference to FIGS. 7A through 7H.

Figure 7A:
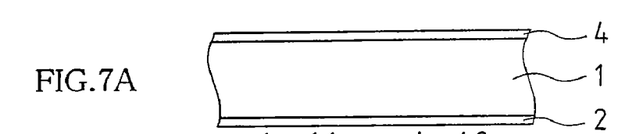
FIGS. 7A through 7H are descriptive diagrams illustrating a method of manufacture for the chip-type LED according to the third embodiment.

In the first step, metallic sheets 2 and 4 are formed on the front surface and rear surface of the insulating substrate 1, respectively (FIG. 7A).

Figure 7B:
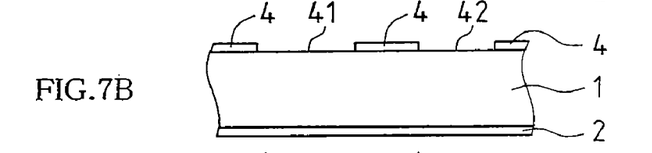

In the next step, the metallic sheet 4 is removed at an LED chip mounting position 41, a metallic small-gauge wire connecting position 42, and the position at which the metallic small-gauge wire 6 is to be disposed (the position where the concave groove 11 is to be formed) on the front surface side of the insulating substrate 1 (FIG. 7B).

Figure 7C:
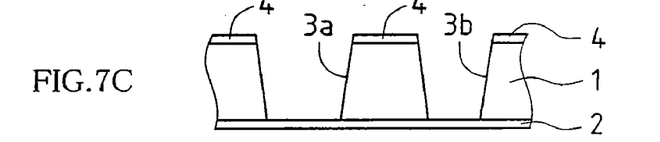

In the next step, the concave holes 3*a* and 3*b* having sloped surfaces are formed through a laser process in the regions 41 and 42, from which the metallic sheet 4 has been removed; the concave holes 3*a* and 3*b* are formed at depths so that they extend to the metallic sheet 2 on the rear surface of the insulating substrate 1. At this time, the concave groove 11 is formed at a predetermined depth through the same laser process in the surface of the partition wall 1*a*, which serves as a partition between the first concave hole 3*a* and the second concave hole 3*b*, so as to span across the first concave hole 3*a* and the second concave hole 3*b* (FIG. 7C). In the present third embodiment, the internal diameter of the first concave hole 3*a* used for mounting the LED chip is φ500 µm, whereas the internal diameter of the second concave hole 3*b* for connecting the metallic small-gauge wire is φ200 µm, and the depth of the concave groove 11 is 25 µm.

Figure 7D:
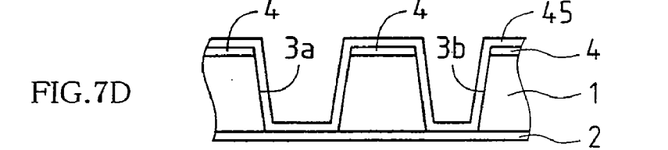

In the next step, a 15 µm-thick Cu plate layer 45 is formed, through plating, from the front surface side of the insulating substrate 1, so as to extend across the side surfaces of the concave holes 3*a* and 3*b* and the bottom surface of the metallic sheet 2 (FIG. 7D). Areas where the Cu plating is unnecessary are protected using a resist.

In the next step, a 15 µm-thick Ni/Au layer is formed of the surface of the plate layer 45 through vapor deposition.

Figure 7E:
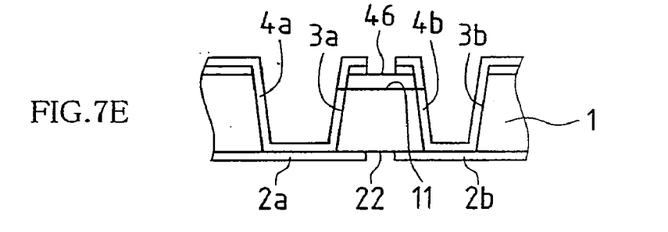

In the next step, the unnecessary portion of the Ni/Au layer, Cu plate layer 45, and metallic sheet 4 on the front surface of the insulating substrate 1 are removed (indicated by reference numeral 46), and the unnecessary portion of the metallic sheet 2 on the rear surface of the insulating substrate 1 is also removed (indicated by reference numeral 22), in order to form insulating regions (FIG. 7E). Through this, the metallic sheet 4*a*, which serves as the first wiring pattern, and the metallic sheet 4*b*, which serves as the second wiring pattern, are formed on the front surface of the insulating substrate 1 in an insulated state. Meanwhile, a metallic sheet 2*a* opposite the metallic sheet 4*a* serving as the first wiring pattern, and a metallic sheet 2*b* opposite the metallic sheet 4*b* serving as the second wiring pattern, are formed on the rear surface of the insulating substrate 1 in an insulated state. In the present third embodiment, in this step, the Ni/Au layer and the Cu plate layer 45 are also removed from the surface of the concave groove 11 for disposing the metallic small-gauge wire 6. In other words, the insulating substrate 1 is in an exposed state at the surface of the concave groove 11.

Figure 7F:
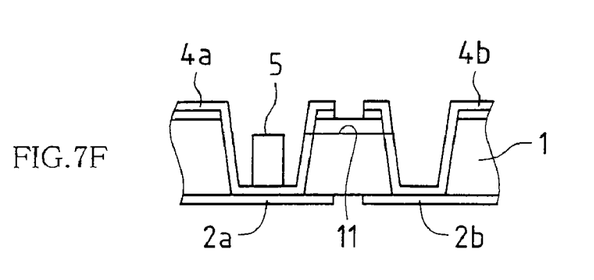

In the next step, the LED chip 5 is mounted onto the metallic sheet 4*a* on the bottom surface of the concave hole 3*a*, which is for mounting the LED chip, using a silver paste (FIG. 7F).

Figure 7G:
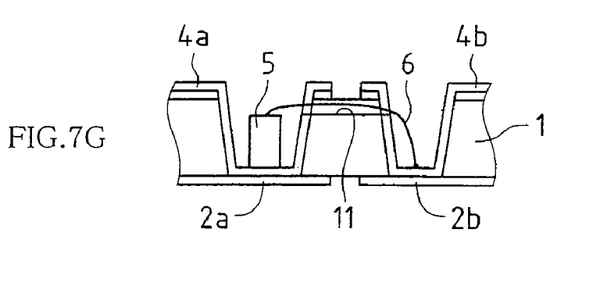

In the next step, the mounted LED chip 5 is electrically connected to the metallic sheet 4*b* on the bottom surface of the concave hole 3*b*, which is for connecting a metallic small-gauge wire, using the metallic small-gauge wire 6, by bonding the metallic small-gauge wire 6 thereto (FIG. 7G).

Figure 7H:
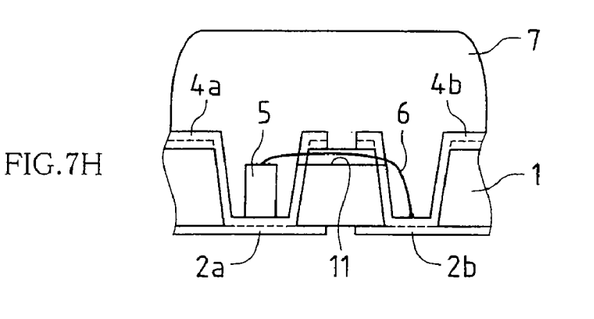

In the next step, the entire front surface of the insulating substrate 1 is sealed with, for example, silicon resin, which is a clear resin, that includes a fluorescent material, so that the LED chip 5 and the metallic small-gauge wire 6 are also contained within the clear resin (FIG. 7H).

Finally, through dice cutting, the chip-type LED 30 is manufactured at dimensions of 1.65 mm in width, 0.75 mm in thickness, and 0.15 mm in height (see FIG. 5).

According to the present third embodiment, the chip-type LED is formed so that the metallic small-gauge wire 6 passes through the concave groove 11 that has been formed between the concave hole 3*a* for mounting the LED chip and the concave hole 3*b* for connecting the metallic small-gauge wire, making it possible to manufacture the chip-type LED 30, which has an even lower height of 0.15 mm.

Although the above first through third embodiments discuss a single-chip LED lamp having a single pair of patterns with respect to the insulating substrate, it should be noted that a multi-color (i.e. having plural LED chips) LED lamp can easily be configured by forming plural patterns through the same method as described above and connecting plural LED chips.

Note that the present invention may be embodied in other forms without departing from the spirit or essential characteristics thereof Accordingly, the embodiments disclosed in this application are to be considered in all respects as illustrative and not limiting. The scope of the invention is indicated by the appended claims rather than by the foregoing description. Furthermore, all changes which come within the meaning and range of equivalency of the claims are intended to be embraced therein.

What is claimed is:

1. A chip-type LED comprising:
an insulating substrate in which a first concave hole and a second concave hole are formed;
a metallic sheet that serves as a first wiring pattern and is formed at a portion that includes the first concave hole;
a metallic sheet that serves as a second wiring pattern and is formed at a portion that includes the second concave hole;
an LED chip mounted on the first wiring pattern inside the first concave hole;
a metallic small-gauge wire electrically connecting the LED chip to the second wiring pattern inside the second concave hole; and
a clear resin sealing the chip-type LED,
wherein the first concave hole is not formed in the second concave hole, and the first wiring pattern covers a sidewall of the first concave hole, and
the metallic sheet serving as the first wiring pattern and the metallic sheet serving as the second wiring pattern extend over and are exposed on a bottom surface of the insulating substrate so as not to be covered by any other material.

2. The chip-type LED according to claim 1, wherein a bottom surface of the first concave hole on which the LED chip is mounted and a bottom surface of the second concave hole to which the metallic small-gauge wire is connected from the LED chip are formed at approximately a same height.

3. The chip-type LED according to claim 1, further comprising a third concave hole formed in the insulating substrate so that another metallic small-gauge wire connects the LED chip and a third wiring pattern formed in the third concave hole.

4. The chip-type LED according to claim 1, wherein a groove portion for disposing the metallic small-gauge wire is formed in a surface portion of a wall between the first concave hole and the second concave hole.

5. The chip-type LED according to claim 1, wherein the clear resin includes a fluorescent material.

6. The chip-type LED according to claim 1, wherein inner circumferential surfaces of the concave holes are formed with slopes so that the concave holes flare outwards in the direction from a rear surface of the insulating substrate to a front surface of the insulating substrate.

7. The chip-type LED according to claim 1, wherein the first wiring pattern extends over both a top surface and a bottom surface of the insulating substrate.

* * * * *